United States Patent
Hiraishi

(10) Patent No.: US 10,720,201 B2
(45) Date of Patent: Jul. 21, 2020

(54) TIMING CONTROL FOR INPUT RECEIVER

(71) Applicant: Micron Technology, Inc., Boise, ID (US)

(72) Inventor: Atsushi Hiraishi, Annaka (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/544,330

(22) Filed: Aug. 19, 2019

(65) Prior Publication Data
US 2019/0371388 A1    Dec. 5, 2019

Related U.S. Application Data

(60) Continuation of application No. 15/973,192, filed on May 7, 2018, now Pat. No. 10,410,712, which is a division of application No. 15/464,907, filed on Mar. 21, 2017, now Pat. No. 9,984,740.

(51) Int. Cl.
| | |
|---|---|
| *G11C 8/18* | (2006.01) |
| *G11C 11/4076* | (2006.01) |
| *G06F 13/16* | (2006.01) |
| *G11C 11/4099* | (2006.01) |
| *G11C 11/4096* | (2006.01) |
| *G11C 7/10* | (2006.01) |
| *G11C 7/22* | (2006.01) |

(52) U.S. Cl.
CPC ...... *G11C 11/4076* (2013.01); *G06F 13/1689* (2013.01); *G11C 7/1093* (2013.01); *G11C 7/222* (2013.01); *G11C 11/4096* (2013.01); *G11C 11/4099* (2013.01); *G11C 2207/2254* (2013.01); *Y02D 10/14* (2018.01)

(58) Field of Classification Search
CPC ............ G11C 11/4076; G11C 11/4096; G11C 11/4099; G06F 13/1689
USPC .................................................. 365/189.07
See application file for complete search history.

(56) References Cited

U.S. PATENT DOCUMENTS

| | | | |
|---|---|---|---|
| 8,842,492 B2 | 9/2014 | Shaeffer et al. | |
| 9,658,642 B2 * | 5/2017 | Mozak | ............ G11C 7/222 |
| 9,984,740 B1 | 5/2018 | Hiraishi | |
| 2007/0217559 A1 | 9/2007 | Stott et al. | |
| 2010/0103746 A1 | 4/2010 | Ma | |

(Continued)

FOREIGN PATENT DOCUMENTS

WO    2018175613 A1    9/2018

OTHER PUBLICATIONS

International Search Report and Written Opinion dated Jul. 4, 2018 for PCT Application No. PCT/US2018/023603, 12 pages.

(Continued)

*Primary Examiner* — Xiaochun L Chen
(74) *Attorney, Agent, or Firm* — Dorsey & Whitney LLP

(57) ABSTRACT

Apparatuses for receiving an input signal in a semiconductor device are described. An example apparatus includes a signal receiver that receives information signal: a control circuit that provides a plurality of control signals; and a signal receiver replica circuit that receives a first reference signal. The signal receiver replica circuit includes a plurality of receivers. Each receiver of the plurality of receivers receives the first reference signal and a corresponding control signal of the plurality of control signals, and further provides an output signal.

20 Claims, 9 Drawing Sheets

(56) References Cited

U.S. PATENT DOCUMENTS

| | | | |
|---|---|---|---|
| 2010/0135100 A1* | 6/2010 | Chiu | .................. G11C 7/222 |
| | | | 365/233.11 |
| 2013/0044845 A1 | 2/2013 | Zerbe | |
| 2013/0208818 A1 | 8/2013 | Shaeffer et al. | |
| 2015/0003574 A1 | 1/2015 | Mozak | |
| 2015/0309726 A1 | 10/2015 | McCall et al. | |
| 2018/0277194 A1 | 9/2018 | Hiraishi | |

OTHER PUBLICATIONS

"Jedec Standard", Low Power Double Data Rate 4 (LPDDR4)—JESD209-49 (Aug. 2014), pp. 181-185.

* cited by examiner (Before calibration)

(After calibration)

TIMING CONTROL FOR INPUT RECEIVER

CROSS-REFERENCE TO RELATED APPLICATION(S)

This application is a continuation of U.S. patent application Ser. No. 15/973,192, filed May 7, 2018, which is a divisional of U.S. patent application Ser. No. 15/464,907, filed Mar. 21, 2017, issued on May 29, 2018 as U.S. Pat. No. 9,984,740. These applications and patent are incorporated by reference herein in their entirety and for any purposes.

BACKGROUND

Low power consumption, high data reliability, high speed of memory access, and reduced chip size are features that are demanded from semiconductor memory.

In recent years, there has been an effort to reduce power consumption for semiconductor devices. As part of that effort to reduce power consumption, it may be desirable to include an input receiver circuit having a receiver of a low power "latch and amplify" type arranged as "an un-matched receiver" that may receive a signal with a small swing in an input buffer for receiving a signal. Such receiver is discussed in, for example, US 2015/0003574 A1 and may include a differential amplifier receiver and a sampler circuit. The differential amplifier receiver may receive a pair of complementary clock signals or a pair of complementary data strobe (DQS) signals and provide a clock/DQS signal with a delay equivalent to an internal delay to the sampler circuit. The sampler circuit may be a latch that may receive an address/command or data signal with a reference voltage Unstable power source voltages and temperature cause delays in a differential amplifier receiver and a clock/DQS tree fluctuated and data reception error may occur. This can be explained by a deviation of a phase-level relationship between the received data and the Strobe/Clock in the sampler circuit (e.g., latch) caused in power-up operations or while receiving data. In order to confirm the fluctuations in the delays, a conventional example (JEDEC specification JESD209-4A Low Power Double Data Rate 4) shows a receiver circuit that includes a DQS interval oscillator. A memory controller may operate the oscillator for a predetermined period of time, and a memory unit executes measurements by using a counter and provides a count of the counter to the memory controller. Thus, the delay fluctuations in the differential amplifier and the strobe/CLK distribution tree may be observed. The memory controller may continuously obtain the fluctuations of the delays by comparing the delays between two counts of two timings, and determines whether a re-training (re-adjustment) process is executed. Because the fluctuations may be provided as counts in the oscillator in integer, a delay that corresponds to a value between two integers may be suppressed. Thus, a short measurement period may result in error of the delay measurement and a measurement period of about 50-100 ns may be required for the delay measurement. Thus, it is difficult to apply the oscillator for a measurement of a power-source fluctuation or the like of a short cycle (20 MHz or more). Moreover, fluctuations in a power supply voltage due to parallel resonance between a power-supply based inductance of a package and an on-die capacitance of a memory chip occurs near 20-100 MHz, and jitters of the receiver are increased as unrecoverable delay fluctuations to cause a high frequency operation dysfunctional. Furthermore, the memory controller is not able to interrupt ongoing memory access operations (e.g., read or write operation) and adjustment to the fluctuations by using intervals while in the ongoing memory access operations is difficult and inefficient, regardless necessity of adjustment observed by using the oscillator.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
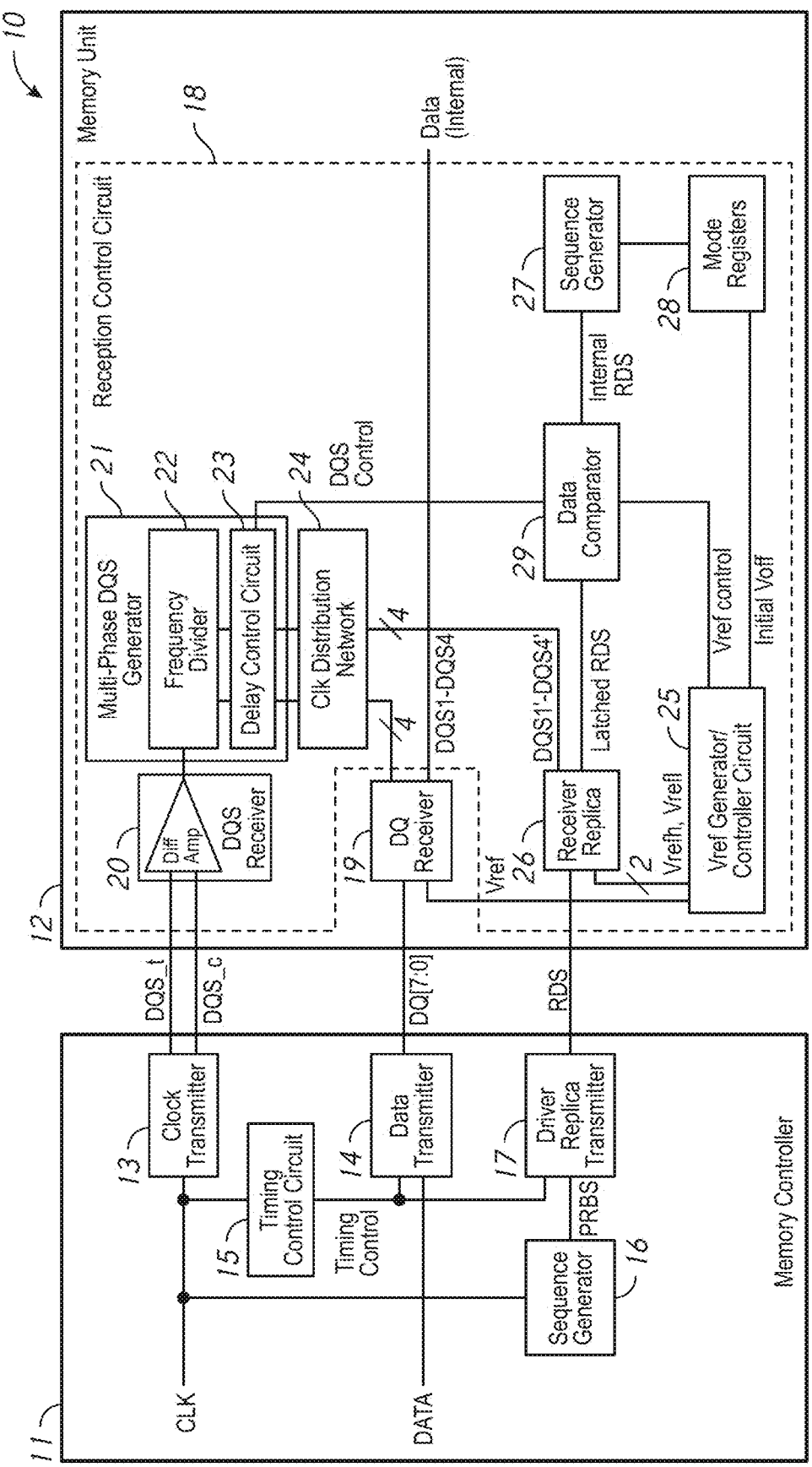
FIG. 1 is a block diagram of a semiconductor device in accordance with the present disclosure.

FIG. 1 is a block diagram of a system 10 in accordance with the present disclosure. For example, the system 10 may include a memory controller 11 and a memory unit (or device) 12. The memory unit 12 may be a Low Power Double Data Rate 4 synchronous dynamic random access memory (LPDDR4 SDRAM) integrated into a single semiconductor chip, for example. For example, the memory controller 11 may include a clock transmitter 13. The clock transmitter 13 may receive a signal CLK and may provide a pair of complementary data strobe signals DQS_t and DQS_c based on the clock signal CLK. The memory controller 11 may further include a timing control circuit 15. The timing control circuit 15 may receive the clock signal CLK and provide a timing control signal based on the clock signal CLK. The memory controller 11 may include a data transmitter 14. The data transmitter 14 may receive a data signal DATA and the timing control signal, and may provide the data signal DQ[7:0] responsive to the timing control signal. The memory controller 11 may further include a driver replica transmitter 17 coupled to the timing control circuit 15. For example, the driver replica transmitter 17 may provide a predetermined reference data sequence (RDS) signal responsive to the timing control signal. For example, the predetermined RDS signal may be generated by a sequence generator 16. For example, the sequence generator 16 may be a linear feedback shift register (LFSR). The memory controller 11 may include the LFSR 16 coupled to the driver replica transmitter 17. For example, the sequence generator 16 may generate a data sequence signal, such as a pseudo random binary sequences (PRBS) signal, responsive to the clock signal CLK. Thus, the PRBS signal may be used as the predetermined RDS signal. The driver replica transmitter 17 may receive the PRBS signal from the sequence generator 16 and the timing control signal from the timing control circuit 15, and may provide a timed PRBS signal as the predetermined RDS signal responsive to the timing control signal. Thus, the predetermined RDS signal may be used for monitoring a delay on a data path for transmitting DQ[7:0].

The memory unit 12 may include a data strobe (DQS) receiver 20, a data (DQ) receiver 19 and a receiver replica circuit 26. For example, the memory unit 12 may include a reception control circuit 18 that includes the DQS receiver 20 and the receiver replica circuit 26. The data strobe (DQS) receiver 20 may include a differential amplifier that may receive the complementary data strobe signals DQS_t and DQS_c and provide a data strobe signal DQS(F, $\phi_1$), wherein F is a clock frequency and $\phi_1$ is a phase (=+0°, to a multi-phase data strobe (DQS) generator 21. For example, the multi-phase DQS generator 21 may include a frequency divider 22 and a delay control circuit 23. For example, the frequency divider 22 may generate a partial clock signal that has a divided frequency F' that is one quarter value of the frequency F of the DQS signal (F'=¼ F) or one half value of the frequency F of the DQS signal (F'=½ F). In this example, the divided frequency F' is one quarter value of the frequency F of the DQS signal (F'=¼ F), and the frequency divider 22 may initially provide four-phase strobe signals DQS1(F', $\phi_1$), DQS2(F', $\phi_2$), DQS3(F', $\phi_3$) and DQS4(F', $\phi_4$), where phases $\phi_2$, $\phi_3$, $\phi_4$ are +90°, 180°, and +270°, respectively. The frequency divider 22 may provide four-phase replica strobe signals DQS1'(F', $\phi_1$-θ-off), DQS2'(F', $\phi_2$-θoff), DQS3'(F', $\phi_3$+θoff) and DQS4'(F', $\phi_4$+θoff), where θoff is a delay offset. The delay control circuit 23 may adjust a phase (a delay θ) of the DQS signal responsive to a DQS control signal from a data comparator 29 and provide the DQS1-DQS4 signals and the DQS1'-DQS4' signals to the DQ receiver 19 and the receiver replica circuit 26, respectively via a clock (Clk) distribution network 24. The reception control circuit 18 may include a reference voltage (Vref) generator and controller circuit 25. The Vref generator and controller circuit 25 may provide a reference voltage Vref to the DQ receiver 19, as well replica reference voltages Vrefh (=Vref+Voff, where Voff is an offset voltage) and Vrefl (=Vref−Voff) to the receiver replica circuit 26. For example, the Vref generator and controller circuit 25 may receive an initial offset voltage Voff from mode registers 28 and adjust the Vref, Vrefh and Vrefl responsive to a reference voltage (Vref) control signal data from the data comparator 29 to adjust the Vref signal and provide the Vref signal and the Vrefh and Vrefl signals to the DQ receiver 19 and the receiver replica circuit 26, respectively. The reception control circuit 18 may include a sequence generator 27 that may be a predetermined linear feedback shift register (LFSR). The sequence generator 27 may generate an internal RDS signal, such as a reference pseudo random binary sequences signal PRBSref, based on common LFSR configuration information preprogrammed in the mode registers 28 that is also provided for the sequence generator 16 separately. Thus, the internal RDS signal may be provided to the data comparator 29. The receiver replica circuit 26 may receive the RDS signal as well as the DQS1'-DQS4' signals and the Vrefh and Vrefl signals and provide latched RDS signal to the data comparator 29. The data comparator 29 may execute an XOR function, taking the internal RDS signal and the latched RDS signal, and may provide the DQS control signal and the Vref control signal based on a result of the XOR function. The delay control circuit 23 may further adjust timings of the DQS1-DQS4 and DQS1'-DQS4' signals responsive to the DQS control signal. The Vref generator/controller circuit 25 may adjust the Vref, Vrefh and Vrefl signals responsive to the Vref control signal.

Figure 2:
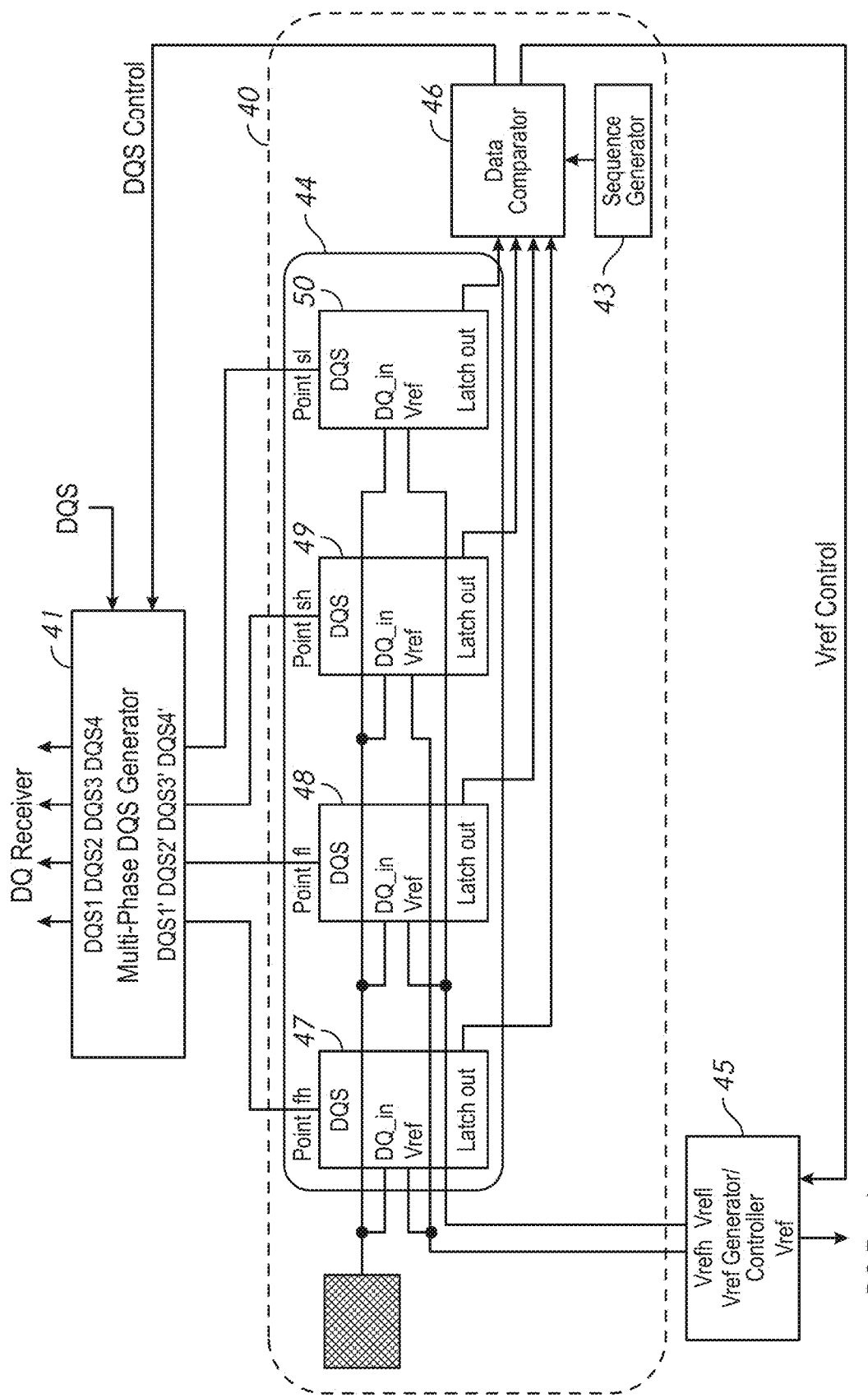
FIG. 2 is a schematic diagram of real-time calibration with a receiver replica path in a semiconductor device in accordance with the present disclosure.
Figure 3:
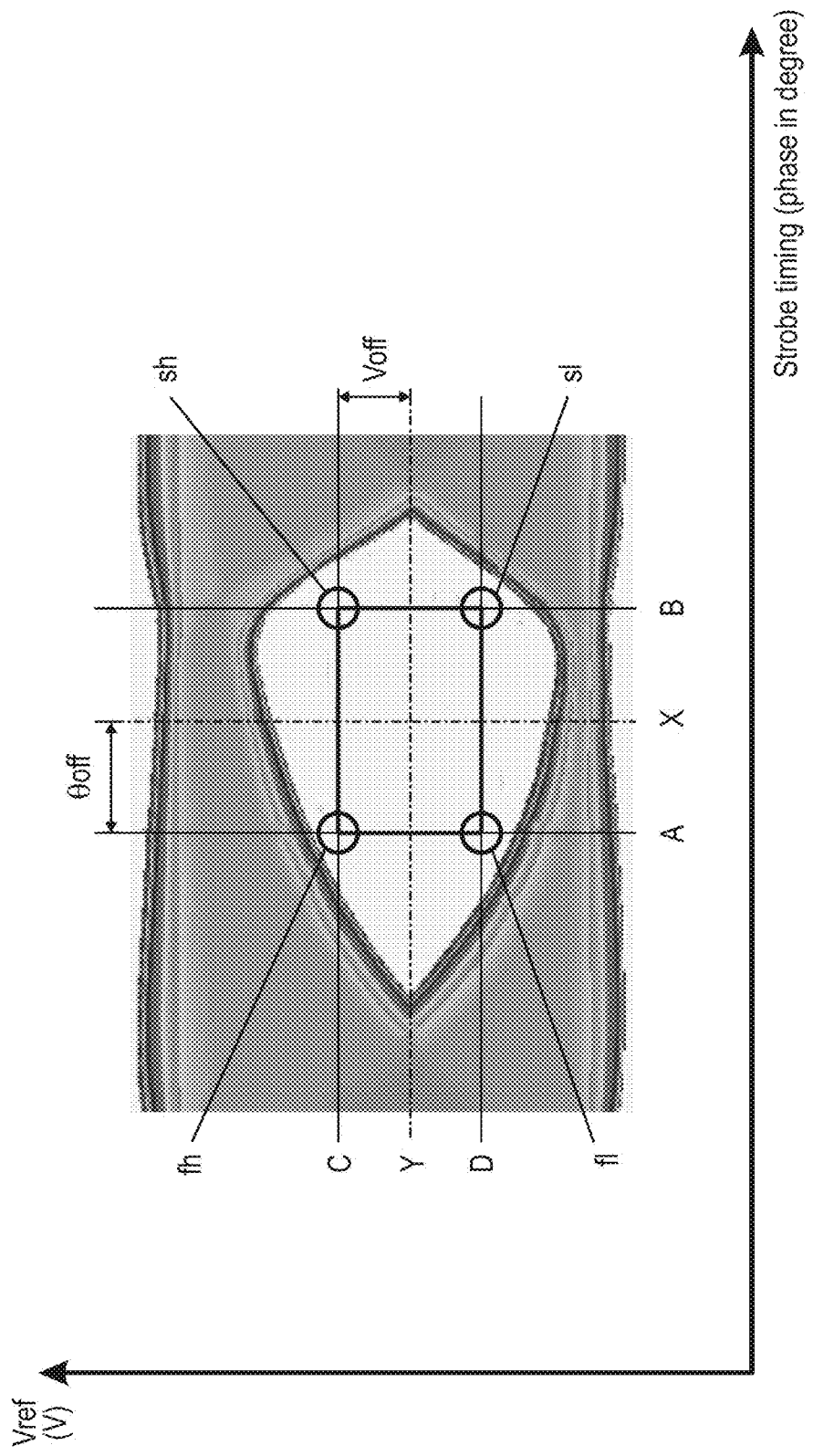
FIG. 3 is a schematic diagram of a relationship between a data strobe timing and a reference voltage in a receiver replica circuit in accordance with the present disclosure.

FIG. 2 is a schematic diagram of real-time calibration with a receiver replica path 40 in a semiconductor device in accordance with the present disclosure. The receiver replica path 40 may include a receiver replica circuit 44, a data comparator 46, and a sequence generator 43. The receiver replica path 40 and a data path (not shown) may share a reference voltage (Vref) generator/controller circuit 45 and a multi-phase DQS generator 41. For example, the receiver replica circuit 44 may include four receivers 47, 48, 49 and 50. For example, the receivers 47, 48, 49 and 50 may be "latch and amplify" type receivers that may function as replicas of a data (DQ) receiver (e.g., the DQ receiver 19 in FIG. 1). FIG. 3 is a schematic diagram of a relationship between a data strobe timing and a reference voltage in a receiver replica circuit 44, in accordance with the present disclosure. For example, FIG. 3 is a reception eye diagram which illustrates a relationship between the data strobe timing and the reference voltage in the receiver replica circuit 44. In FIG. 3, a horizontal axis represents a strobe timing expressed as a phase in degree and a vertical axis represents a reference voltage (V). For example, a receiver having a reference voltage and a strobe timing within a white eye-shape region may receive data correctly and a receiver having the reference voltage and the strobe timing outside the white eye-shape region may fail to receive data. For example, the data (DQ) receiver (e.g., the DQ receiver 19 in FIG. 1) may be set to have a strobe timing center X and a reference voltage center Y in a calibration process included in a power up operation. In the receiver replica circuit 44, the four receivers 47, 48, 49 and 50 are designed to receive data at a point fh defined by a reference voltage C at strobe timing A, a point fl defined by a reference voltage D at the strobe timing A, a point sh defined by the reference voltage C at strobe tuning B, and a point sl defined by the reference voltage D at the strobe timing B, respectively. Here, the strobe timing A is advanced in phase (X−θoff) and the strobe timing B is delayed in phase (X+θoff), where θoff is a delay offset. The reference voltage Y may be a reference voltage Vref and the reference voltages C and D may be replica reference voltages Vrefh (=Y+Voff, where Voff is an offset voltage) and Vrefl (=Y−Voff). From FIG. 3, a data signal may be received without an error as long as the strobe timing and the reference voltage are within an area defined by the points fh, fh, sh and sl. For example, the offset voltage Voff and the delay offset θoff may be configured in the calibration in a manner that all signals may be received, which will be described in detail along with FIG. 5.

For example, the multi-phase DQS generator 41 may receive a data strobe signal DQS(F, $\phi_1$), wherein F is a clock frequency and $\phi_1$ is a phase (=+0°), and generate a partial clock signal that has a divided frequency F' that is one quarter value of the frequency F of the DQS signal (F'=¼ F), and the multi-phase DQS generator 41 may initially provide four-phase strobe signals DQS1(F', $\phi_1$), DQS2(F', $\phi_2$), DQS3 (F', $\phi_3$) and DQS4(F', $\phi_4$), where phases $\phi_2$, $\phi_3$, $\phi_4$ are +90°, +180°, and +270° to the DQ receiver (e.g., the DQ receiver 19 in FIG. 3). The multi-phase DQS generator 41 may provide four-phase replica strobe signals DQS1'(F', $\phi_1$-θoff), DQS2'(F', $\phi_2$-θoff), DQS3'(F', $\phi_3$+θoff) and DQS4'(F', $\phi_4$+θoff) to DQS nodes of the receivers 47, 48, 49 and 50 respectively, by adjusting four-phase strobe signals DQS1 (F', $\phi_1$), DQS2(F', $\phi_2$), DQS3(F', $\phi_3$) and DQS4(F', $\phi_4$) with the delay offset θoff. For example, the reference voltage (Vref) generator and controller circuit 45 may provide a reference voltage Vref to the DQ receiver (e.g., DQ receiver 19 in FIG. 1), as well the replica reference voltage Vrefh to vref nodes of the receivers 47 and 49 and the replica reference voltage Vrefl to vref nodes of the receivers 48 and 50. Thus, the receivers 47-50 may receive data signals at DQ nodes at the four points fh, fl, sh and sl, and may provide latched data from Latch out nodes. The data comparator 46 may receive the latched data from the receivers 47-50 and compare the data with a sequence data from the sequence generator 43. Depending on a result of the comparison, the data comparator 46 may provide a DQS control signal to the multi-phase DQS generator 41 to adjust the strobe timing center X corresponding to a phase (e.g., a delay) of the DQS signal and may provide a Vref control signal to the Vref generator/controller circuit 45 to adjust the reference voltage (Vref) center Y.)

Figure 4A:
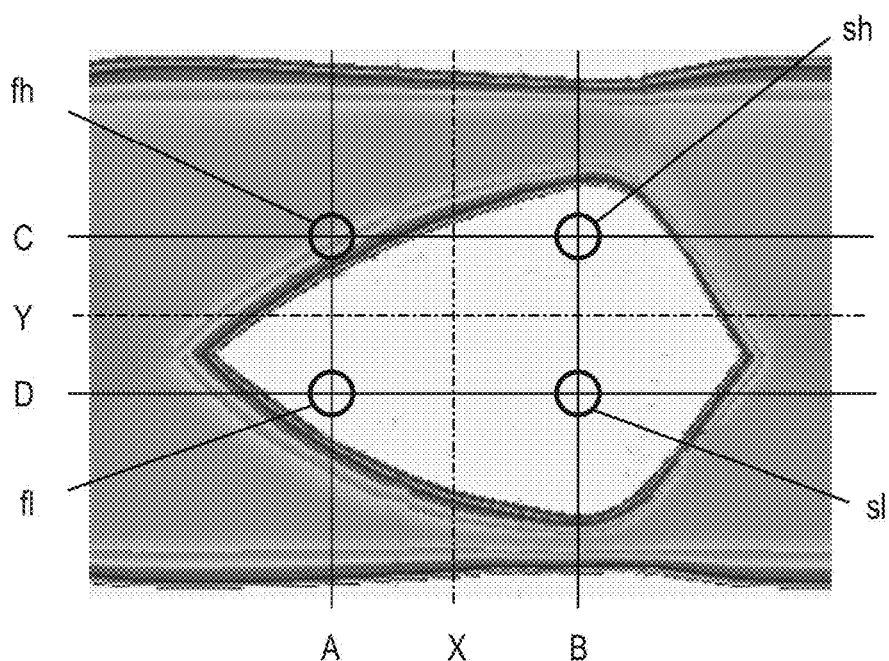
FIG. 4A is a schematic diagram of a relationship between a data strobe timing and a reference voltage in the receiver replica circuit before calibration in accordance with the present disclosure.
Figure 4B:
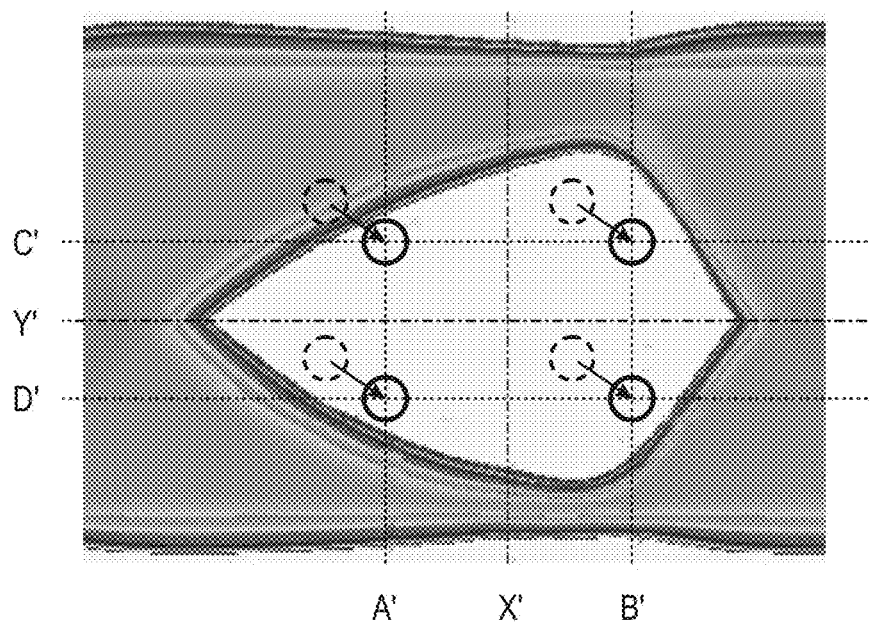
FIG. 4B is a schematic diagram of a relationship between a data strobe timing and a reference voltage in the receiver replica circuit after calibration in accordance with the present disclosure.

FIG. 4A is a schematic diagram of a relationship between a data strobe timing and a reference voltage in the receiver replica circuit before calibration, in accordance with the present disclosure. FIG. 4B is a schematic diagram of a relationship between a data strobe timing and a reference voltage in the receiver replica circuit after calibration, in accordance with the present disclosure. As shown in FIG. 4A, a receiver has a reference voltage C and a strobe timing A at point fh outside the white eye region and the receiver may fail to receive data correctly. By calibrating the strobe timing center X and the reference voltage center Y to a new strobe timing center X' (=X+strobe delay_shift) and a new reference voltage center Y' (=Y+Vref_shift) as shown in FIG. 4B, the points th, fl, sh and sl defined by the reference voltages C' (=Y'+Voff) and D' (=Y'−Voff) and the strobe timings A' (=X'−θoff) and B' (=X'+θoff) may be included within the white eye region of the receiver, thus the receiver may be able to receive the data correctly. Thus, calibration responsive to latched signals of the receivers 47-50 on the replica receiver path 40 may provide calibration to the DQ receiver (e.g., DQ receiver 19 in FIG. 1).

Figure 5:
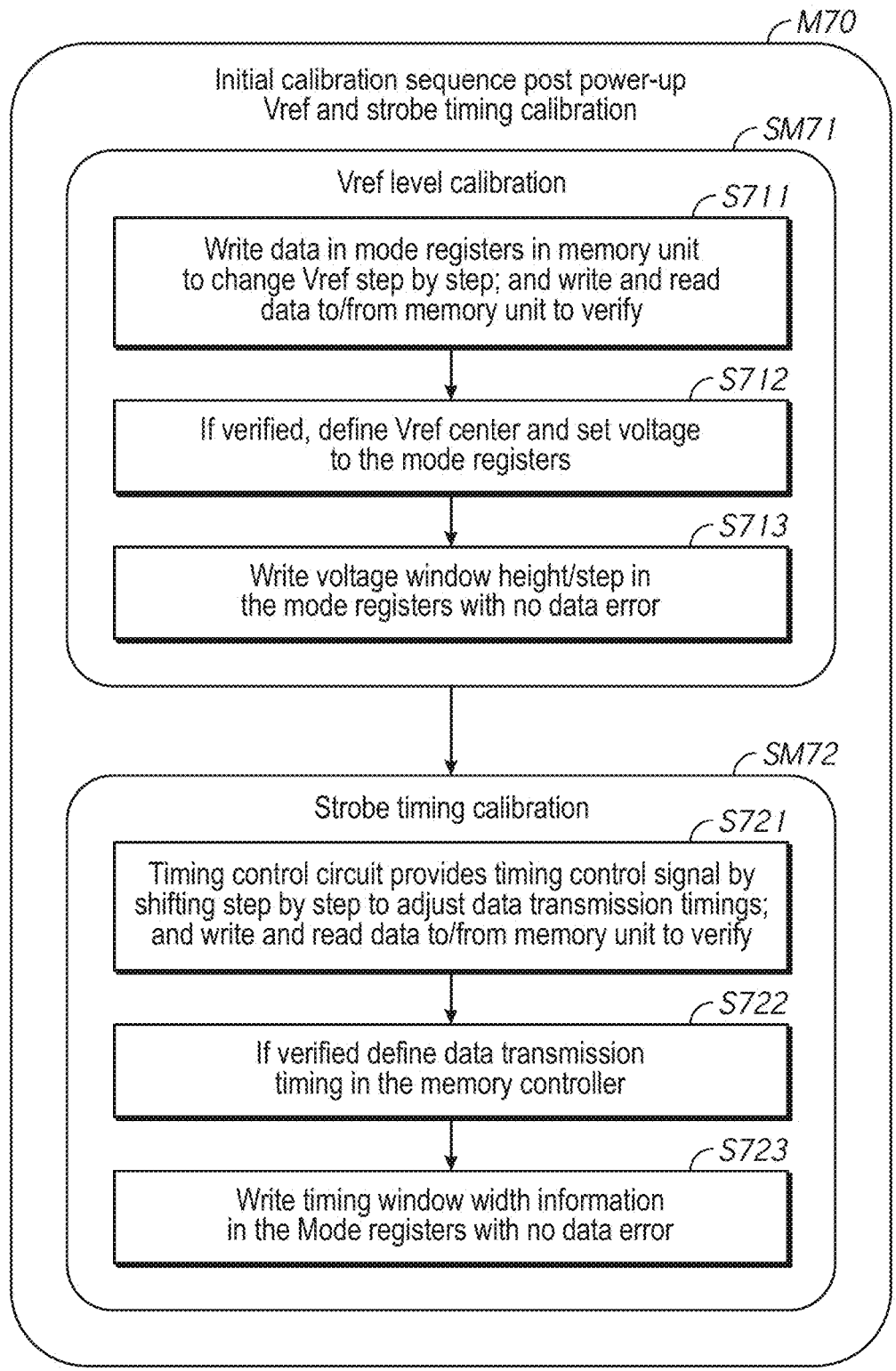
FIG. 5 is a flow diagram of a sample calibration sequence in accordance with the present disclosure.

FIG. 5 is a flow diagram of a sample calibration sequence in accordance with the present disclosure. For example, the sample calibration sequence in the flow diagram of FIG. 5 may be an initial calibration sequence M70 that may be executed after a power-up operation caused by a memory controller (e.g., the memory controller 11 in FIG. 1). For example, the initial calibration sequence M70 may include two submodules SM71 and SM72. The submodule SM71 is Vref level calibration to obtain an offset voltage Voff and the submodule SM72 is strobe timing calibration to obtain a delay offset θoff that is expressed as a phase in degree. The submodules SM71 and SM72 may be executed in a series in an order of SM71, SM72, or an order of SM72, SM71, or may be executed in parallel.

In the submodule SM71, a memory controller (e.g., the memory controller 11 in FIG. 1) may write information of a reference voltage Vref in mode registers (e.g., the mode registers 28 in FIG. 3) in a memory unit (e.g., the memory unit 12 in FIG. 1) to change the reference voltage Vref step by step. The memory controller may control the memory unit to write a data to the memory unit and read the data from the memory unit and verify whether the data is correctly stored (S711). The reference voltage Vref may be modified step by step and the data is verified until the written data and the read data correspond with each other. If verified, a reference voltage center (Vref center) may be fixed (e.g., defined) and set to the mode registers (S712). Based on a current voltage window height (step), an initial Voff without no data errors may be fixed (e.g., defined) and written to the mode registers (S713).

In the submodule SM72, a timing control circuit (e.g., the timing control circuit 15 in FIG. 1) in the memory controller may provide a timing control signal to adjust timing of transmission by shifting the timing step by step. The memory controller may control the memory unit to write a data to the memory unit and read the data from the memory unit and verify whether the data is correctly stored (S721). The timing may be modified step by step and the data is verified until the written data and the read data correspond with each other. If verified, the timing may be fixed (e.g., defined) and set in the memory controller (S722). Based on a current timing window width information that is a delay offset (θoff) without no data errors may be fixed (e.g., defined) and written to the mode registers (S723).

Figure 6:
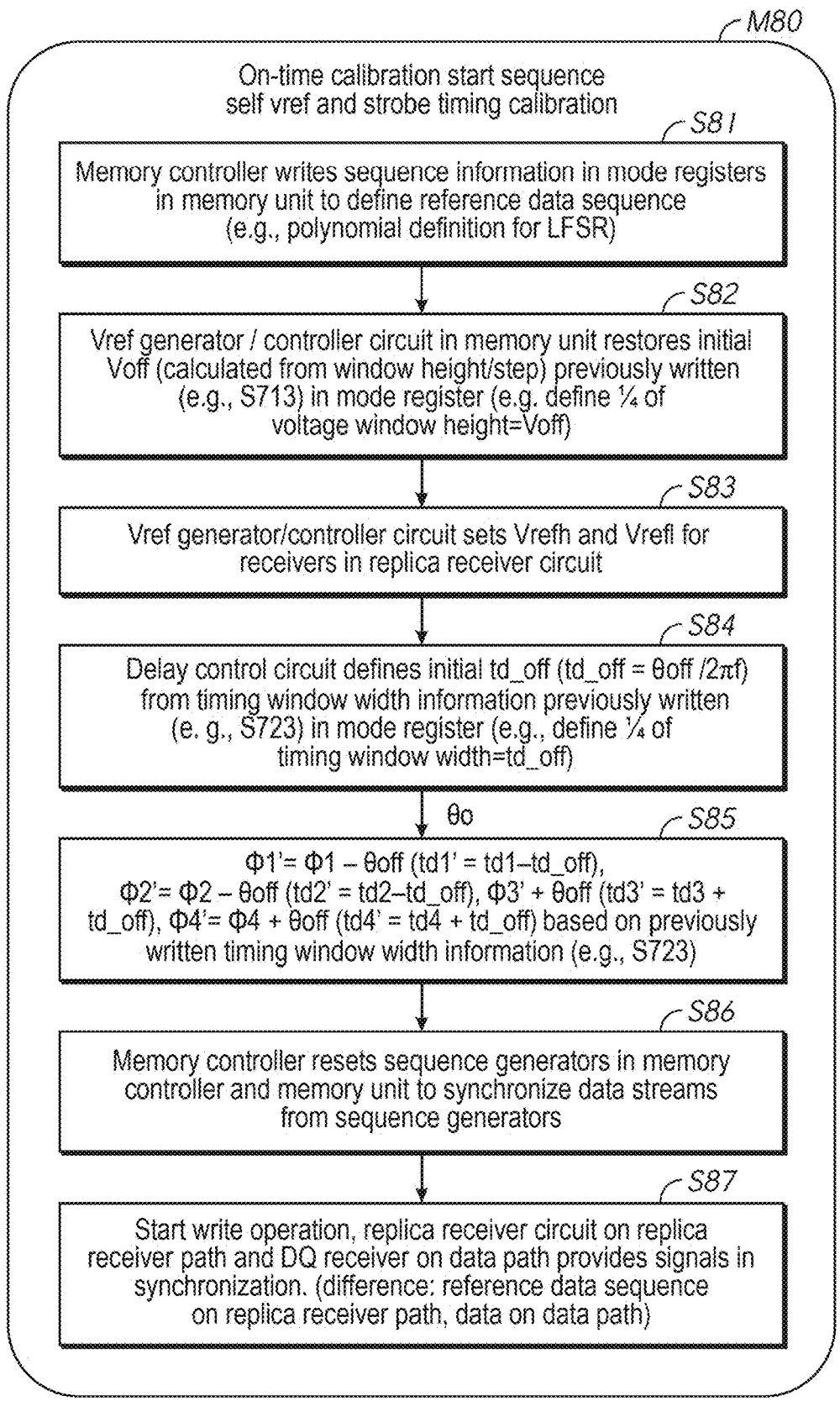
FIG. 6 is a flow diagram of a sample calibration sequence in accordance with the present disclosure.

FIG. 6 is a flow diagram of a sample calibration sequence in accordance with the present disclosure. For example, the sample calibration sequence in the flow diagram of FIG. 6 may be an on-time calibration start sequence M80 that may be a self Vref and strobe timing calibration executed in a normal operation. In the on-time calibration sequence M80, a memory controller (e.g., the memory controller 11 in FIG. 1) may write sequence infoiniation in mode registers (e.g., the mode registers 28 in FIG. 1) in a memory unit (e.g., the memory unit 12 in FIG. 1) to define reference data sequence (e.g., a polynomial definition for LFSR) that may be commonly used by the sequence generators in the memory controller and the memory unit (S81). A Vref generator/controller circuit (e.g., the Vref generator/controller circuit 25 in FIG. 1) in the memory unit may restore the initial Voff previously written (e.g., S713) in the mode registers (e.g., define ¼ of voltage window height=Voff) (S82). Based on the Vref center and the Voff previously written in the mode register, the Vref generator/controller circuit may set Vrefh and Vrefl for receivers (e.g., the receivers 47-50 in FIG. 2) in a replica receiver circuit (e.g., the replica receiver circuit 26 in FIG. 1, the replica receiver circuit 44 in FIG. 2) (S83). A delay control circuit may define initial delay offset time td_off based on (e.g., td_off=θoff/2πf) from timing window width information previously written (e.g., S723) in Mode Register (e.g., define ¼ of timing window width=td_off) (S84)

A delay control circuit may set $\phi_1$'=$\phi_1$−θoff (td1'=td1−td_off), $\phi_2$'=$\phi_2$−θoff (td2'=td2−td_off), $\phi_3$'=$\phi_3$+θoff (td3'=td3+td_off), $\phi_4$'=$\phi_4$+θoff (td4'=td4+td_off). (S85), based on a delay offset (θoff) previously written (e.g., the delay offset θoff in S723). Here, the delays for a data receiver (e.g., the data receiver 19 in FIG. 1) expressed in phases $\phi_1$, $\phi_2$, $\phi_3$, $\phi_4$ are 0°, +90°, +180°, and +270° correspond to delays expressed in time td1, td2, td3 and td4 from DQS timing. Similarly, the delays for the receivers in the receiver replica circuit expressed in phases $\phi_1'$, $\phi_2'$, $\phi_3'$, $\phi_4'$ correspond to delays expressed in time td1', td2', td3' and td4' from DQS timing. The memory controller may reset sequence generators (e.g., the sequence generator 16 and the sequence generator 27) in the memory controller and memory unit to synchronize data streams from sequence generators (S86) so that the sequence generators may provide the same reference data sequence signals via a replica receiver path and directly to a comparator which provide control signals to calibrate the Vref and the strobe timing. In a write operation, the replica receiver circuit on the replica receiver path and the data receiver on the data path may receive signals in synchronization and may provide data on the data path and the reference data sequence on the replica receiver path (S87).

Figure 7:
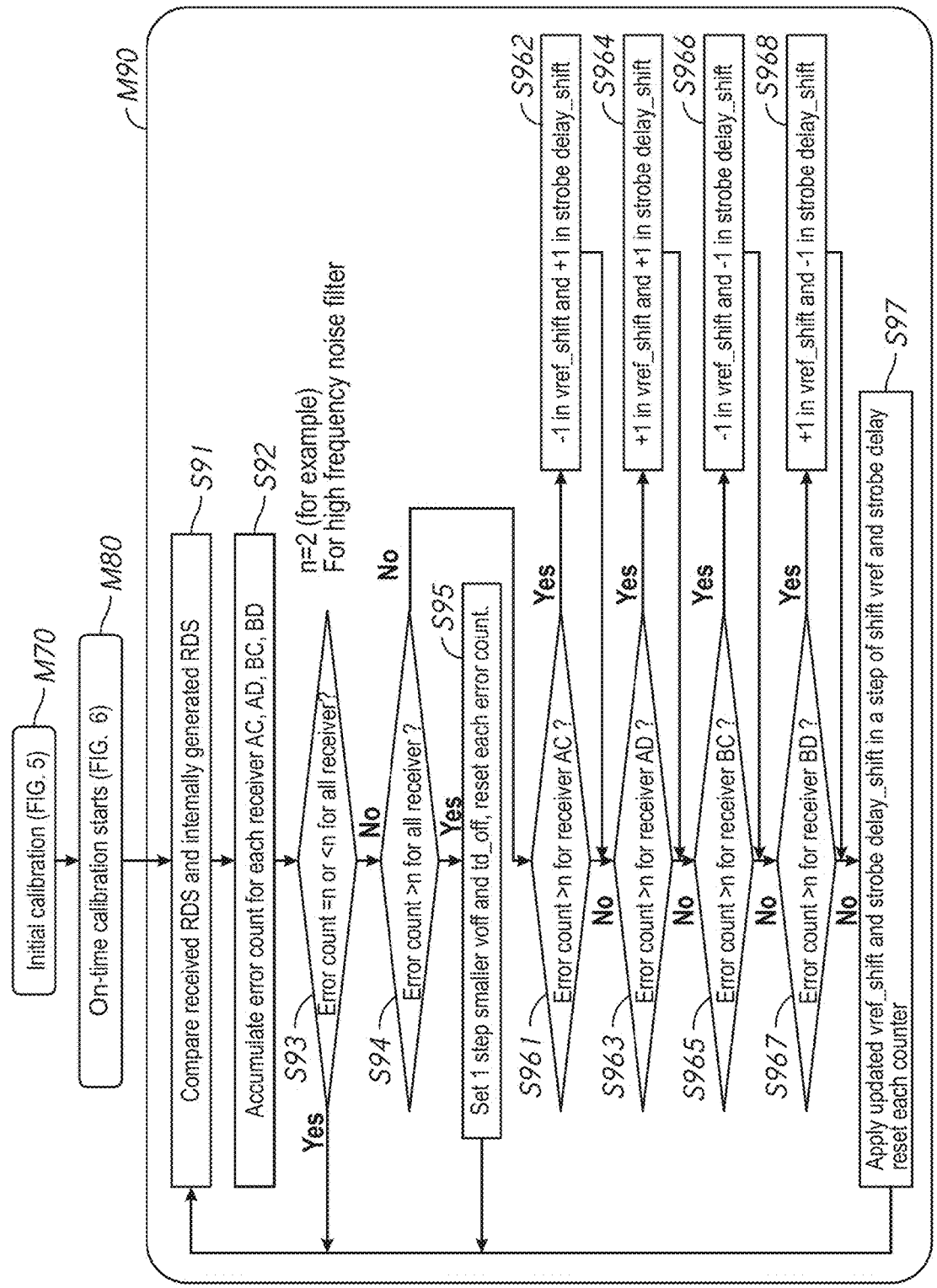
FIG. 7 is a flow diagram of a calibration sequence within a receiver replica circuit in accordance with the present disclosure.

FIG. 7 is a flow diagram of a calibration sequence M90 within a receiver replica path in accordance with the present disclosure. For example, the receiver replica path may be the receiver replica path 40 in FIG. 2. In the calibration sequence M90, a comparator (e.g., a data comparator 46) may compare a reference data sequence (RDS) received via receivers (e.g., the receivers 47-50 in FIG. 2) and RDS generated by a sequence generator (e.g., the sequence generator 43 in FIG. 2) (S91). For example, the RDS may contain data for a defined burst number. For each receivers AC, AD, BC, BD (e.g., receivers 47-50 in FIG. 2, respectively), an error count may be accumulated by incrementing the error count upon detection of a data error (S92). If all receivers have the error counts that are equal to or less than a predetermined number (e.g., the predetermined number n may be two for a high frequency noise filter) ("Yes" in S93), there is no error and the calibration sequence returns to the step S91. If all the error counts are greater than the predetermined number ("Yes" in S94), the offset voltage Voff and the delay offset θoff (or td_off that is the delay offset θoff in time domain) may be set to be one step smaller, and the error counts may be reset to zero (S95) then returns to the step S91. If some of the receivers, but not all the receivers have the error count greater than the predetermined number ("No" in S94), an error count for each receiver may be examined. If an error count for a receiver AC (e.g., the receiver 47 in FIG. 2) is greater than the predetermined number (S961) then Vref_shift (e.g., Y'–Y in FIGS. 4A and 4B) in steps may be decremented and strobe delay_shift (e.g., X'–X in FIGS. 4A and 4B) insteps may be incremented (S962). If an error count for a receiver AD (e.g., the receiver 48 in FIG. 2) is greater than the predetermined number (S963), then the Vref_shift in steps may be incremented and the strobe delay_shift in steps may be incremented (S964). If an error count for a receiver BC (e.g., the receiver 459 in FIG. 2) is greater than the predetermined number (S965), then the Vref_shift in steps may be decremented and the strobe delay_shift in steps may be decremented (S966). If an error count for a receiver BD (e.g., the receiver 50 in FIG. 2) is greater than the predetermined number (S967), then the Vref_shift in steps may be incremented and the strobe delay_shift in steps may be decremented (S968). After examining all the error counts, the Vref_shift and the strobe delay_shift may be updated and the error counts may be reset (S97).

Figure 8:
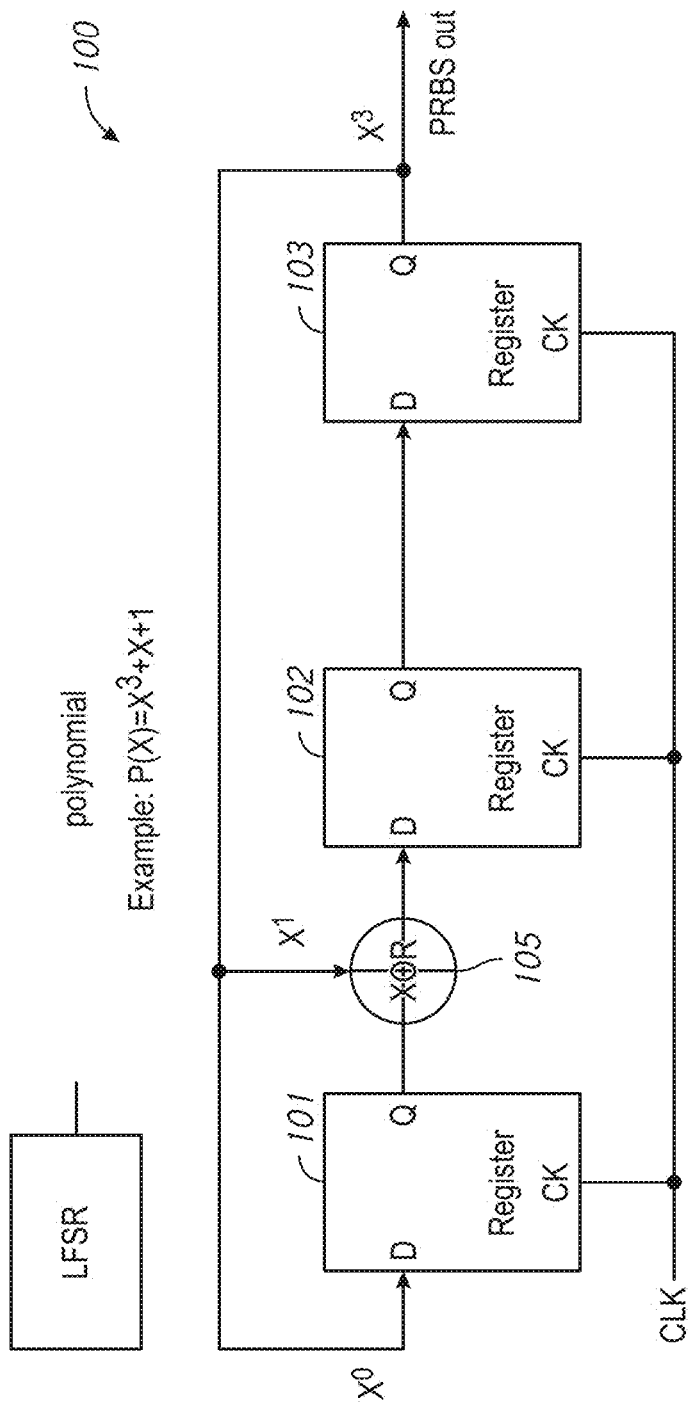
FIG. 8 is a circuit diagram of a LFSR in accordance with the present disclosure.

FIG. 8 is a circuit diagram of a predetermined linear feedback shift register (LFSR) 100 in accordance with the present disclosure. The LFSR 100 has a feedback loop that may include a number of registers and one or more XOR circuits where the number of registers equivalent to a degree of polynomial and positions of XOR circuits may determine a characteristic of polynomial circuit. For example, the LFSR 100 may represent a polynomial expression $P(x)=x^3+x+1$ which is a third degree polynomial. The LFSR 100 may include three registers 101, 102, 103. Because coefficients of the third degree, the first degree and constant is 1 and a coefficient of the second degree is 0. Thus, an output node PRBS out of the LFSR100 may be coupled to an output node an input node of the register 101 representing the constant ($X^0$), an output node of the register 101 via an XOR circuit 105, an output node of the register 103. An output node of the register 102 is not coupled because the coefficient of the second degree is 0. The XOR circuit 105 may receive a signal from the output node of the register 101 and the signal on the output node PRBS out and provide a result of XOR function of the received signals to an input node of the register 102. The output signal of the output node PRBS may provide a periodic sequence that is pseudo random.

Figure 9:
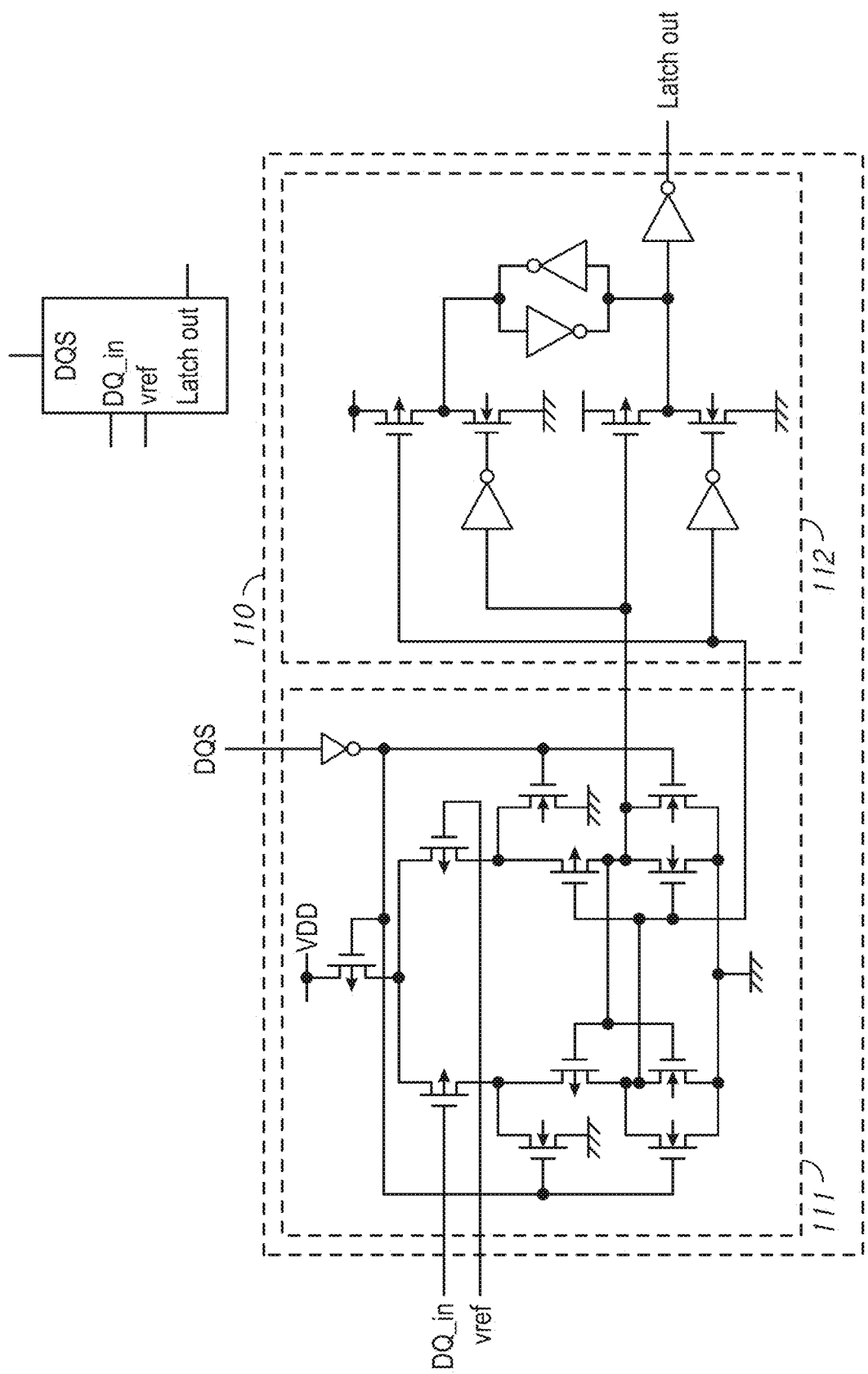
FIG. 9 is a circuit diagram of a receiver in a receiver replica circuit in accordance with the present disclosure.

FIG. 9 is a circuit diagram of a receiver 110 in a receiver replica circuit in accordance with the present disclosure. For example, the receiver 110 may be a "latch and amplify" type receiver that may be used as the receivers 47-50 in the receiver replica circuit 40. The receiver 110 may include a differential amplifier 111 and a latch 112. The differential amplifier 111 may receive a strobe signal DQS, a data input DQ_in and a reference voltage vref to provide a pair of complementary signals. The latch 112 may receive the pair of complementary signals may provide a Latch out signal.

A calibration scheme using a receiver replica path has been described above in a context of data transmission with adjustment of data strobe timing. However the same calibration scheme using a receiver replica path may be applied for an address/command transmission with adjustment of clock timing, which is readily apparent to those of skill in the art based on the description above.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a sequence generator configured to provide a first reference data sequence;
   a receiver replica configured to latch a second reference data sequence received from a memory controller; and
   a data comparator coupled to the sequence generator and the receiver replica, the data comparator configured to compare the first reference data sequence and the latched second reference data sequence to provide control signals;
   wherein the receiver replica is configured to latch the second reference data sequence responsive to a first signal of the control signals.

2. The apparatus of claim 1 further comprising:
a delay control circuit coupled to the data comparator and the receiver replica, and configured to receive a second signal of the control signals from the data comparator and provide multi-phase DQS signals to the receiver replica.

3. The apparatus of claim 2, wherein the delay control circuit is configured to adjust a strobe timing of the multi-phase DQS signals responsive to the second signal of the control signals.

4. The apparatus of claim 2 further comprising:
a reference voltage generator coupled to the receiver replica and the data comparator and configured to provide a first replica reference voltage and a second replica reference voltage to the receiver replica based on the first signal of the control signals and an initial offset voltage.

5. The apparatus of claim 4 further comprising:
a plurality of receivers coupled in parallel, each receiver is configured to latch a respective data in the second reference data sequence responsive to a corresponding DQS signal of the multi-phase DQS signals.

6. The apparatus of claim 5, wherein at least a first of the plurality of receivers is coupled to the reference voltage generator to receive the first replica reference voltage and at least a second of the plurality of receivers is coupled to the reference voltage generator to receive the second replica reference voltage.

7. The apparatus of claim 4 further comprising a mode register configured to store at least the initial offset voltage.

8. A method comprising:
at a memory unit, providing an initial reference data sequence to calibrate a reference voltage;
at the memory unit, restoring an initial offset voltage;
at the memory unit, providing a first replica reference voltage and a second replica reference voltage based on the reference voltage and the initial offset voltage;
at the memory unit, providing an initial delay offset of a strobe timing;
at the memory unit, providing a first reference data sequence and a second reference data sequence synchronized with the first reference data sequence; and
at a data comparator in the memory unit, comparing the first reference data sequence and the second reference data sequence to provide control signals.

9. The method of claim 8, wherein restoring the initial offset voltage comprises determining the initial offset voltage based on a voltage window defined in a mode register.

10. The method of claim 9, wherein providing the initial delay offset of the strobe timing comprises determining the initial delay offset based on a timing window provided in the mode register.

11. The method of claim 8, wherein providing the first reference data sequence and the second reference data sequence comprises:
resetting a sequence generator in the memory unit;
providing the first reference data sequence at the sequence generator in the memory unit; and
providing the second reference data sequence by latching a third reference data sequence provided by a memory controller.

12. The method of claim 10 further comprising:
determining the voltage window and the timing window in an initial calibration process; and
storing information defining the voltage window and the timing window in the mode register.

13. The method of claim 12, wherein the initial calibration process comprises, by a memory controller:
in one or more iterations:
changing the reference voltage:
writing a data to the memory unit;
reading the data from the memory unit; and
verifying the read data with the written data to determine if a data error has occurred; and
determining a reference voltage center and a height of the voltage window based on referenced voltage values from the one or more iterations, in which no data error has occurred.

14. The method of claim 12, wherein the initial calibration process comprises, by the controller:
in one or more iterations:
updating the strobe timing:
writing a data to the memory unit;
reading the data from the memory unit; and
verifying the read data with the written data to determine if a data error has occurred;
determining a data transmission timing and a width of the timing window based on strobe timing values from the one or more iterations, in which no data error has occurred.

15. A method comprising:
at a memory unit, and in one or more iterations:
comparing a first reference data sequence provided by a receiver replica with a second reference data sequence provided by a sequence generator to provide control signals;
accumulating an error count for each of a plurality of receivers in the receiver replica;
if the error count in at least one of the plurality of receivers exceeds a first threshold value:
adjusting an offset voltage and/or a delay offset; and
applying a first signal of the control signals to the receiver replica; and
resetting the error count.

16. The method of claim 15, wherein adjusting the offset voltage and/or the delay offset comprises:
if the error count in all of the plurality of receivers exceeds the first threshold value, decreasing the offset voltage by a step and decreasing the delay offset by a step.

17. The method of claim 15, wherein adjusting the offset voltage and/or the delay offset comprises:
if the error count in a first receiver of the plurality of receivers in the replica receiver exceeds a second threshold value, decreasing the offset voltage by a step and increasing the delay offset by a step;
if the error count in a second receiver of the plurality of receivers in the replica receiver exceeds the second threshold value, increasing the offset voltage by a step and increasing the delay offset by a step;
if the error count in a third receiver of the plurality of receivers in the replica receiver exceeds the second threshold value, decreasing the offset voltage by a step and decreasing the delay offset by a step; and
if the error count in a fourth receiver of the plurality of receivers in the replica receiver exceeds the second threshold value, increasing the offset voltage by a step and increasing the delay offset by a step.

18. The method of claim 15 further comprising:
if the error count in at least one of the plurality of receivers exceeds the first threshold value, additionally applying a second signal of the control signals to a delay control circuit to provide multi-phase DQS signals.

19. The method of claim 18, wherein the first reference data sequence is provided by the receiver replica by latching a third reference data sequence responsive to the multi-phase DQS signals.

20. The method of claim 19, wherein latching the third reference data sequence is further based on reference control signals, wherein the reference control signals are provided based on the control signals and the offset voltage, wherein the control signals include a reference voltage signal.

* * * * *